United States Patent
Pinarbasi et al.

(10) Patent No.: US 8,207,012 B2
(45) Date of Patent: Jun. 26, 2012

(54) METHOD AND APPARATUS FOR ACHIEVING LOW RESISTANCE CONTACT TO A METAL BASED THIN FILM SOLAR CELL

(75) Inventors: Mustafa Pinarbasi, Morgan Hill, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 928 days.

(21) Appl. No.: 12/163,819

(22) Filed: Jun. 27, 2008

(65) Prior Publication Data
US 2009/0269877 A1    Oct. 29, 2009

Related U.S. Application Data

(63) Continuation-in-part of application No. 12/163,162, filed on Jun. 27, 2008, which is a continuation-in-part of application No. 12/111,161, filed on Apr. 28, 2008, now abandoned, application No. 12/163,819, which is a continuation-in-part of application No. 12/123,424, filed on May 19, 2008.

(51) Int. Cl.
*H01L 21/00*    (2006.01)
(52) U.S. Cl. .................. 438/98; 257/E21.001
(58) Field of Classification Search ........... 257/E27.125, 257/E27.124, E27.007, E27.009, E21.001; 438/19, 98
See application file for complete search history.

(56) References Cited

U.S. PATENT DOCUMENTS

| | | | |
|---|---|---|---|
| 3,973,994 A | 8/1976 | Redfield | |
| 4,514,583 A | 4/1985 | Izu et al. | |
| 5,230,753 A | 7/1993 | Wagner | |
| 5,393,695 A | 2/1995 | Takehara | |
| 5,928,437 A | 7/1999 | Dillard | |
| 6,300,556 B1 | 10/2001 | Yamagishi | |
| 6,350,945 B1 | 2/2002 | Mizuno | |
| 6,743,524 B2 | 6/2004 | Schaepkens | |
| 6,841,728 B2 | 1/2005 | Jones et al. | |
| 6,984,804 B2 | 1/2006 | Takeyama et al. | |
| 7,335,555 B2 | 2/2008 | Gee et al. | |
| 8,003,430 B1 * | 8/2011 | Lee | 438/85 |
| 2004/0006867 A1 * | 1/2004 | Becker et al. | 29/610.1 |

(Continued)

FOREIGN PATENT DOCUMENTS

EP    2146355 A1 *  1/2010

(Continued)

OTHER PUBLICATIONS

International Search Report issued Jun. 22, 2009 in PCT/US2009/41973.

(Continued)

*Primary Examiner* — Matthew Landau
*Assistant Examiner* — Latanya N Crawford
(74) *Attorney, Agent, or Firm* — Pillsbury Winthrop Shaw Pittman LLP (57) ABSTRACT

A system and method of forming a thin film solar cell with a metallic foil substrate are provided. After forming a semiconductor absorber film over the front surface of the metallic foil substrate a back surface of the metallic foil substrate is treated using a material removal process to form a treated back surface in a process chamber. In one embodiment, the material removal process is performed while depositing a transparent conductive layer over the semiconductor absorber film in the process chamber.

69 Claims, 3 Drawing Sheets

U.S. PATENT DOCUMENTS

| | | |
|---|---|---|
| 2004/0063320 A1* | 4/2004 | Hollars .................. 438/689 |
| 2004/0088840 A1 | 5/2004 | Miller |
| 2004/0166444 A1* | 8/2004 | Kiso ...................... 430/311 |
| 2004/0198190 A1 | 10/2004 | Basol |
| 2005/0074915 A1 | 4/2005 | Tuttle et al. |
| 2005/0199279 A1 | 9/2005 | Yoshimine et al. |
| 2005/0247340 A1 | 11/2005 | Zeira |
| 2006/0121701 A1 | 6/2006 | Basol |
| 2007/0012353 A1 | 1/2007 | Fischer et al. |
| 2007/0095387 A1* | 5/2007 | Fujii et al. ............. 136/251 |
| 2007/0145507 A1 | 6/2007 | Basol |
| 2007/0169805 A1 | 7/2007 | Sasaki et al. |
| 2007/0227585 A1* | 10/2007 | Yoshimine ............ 136/251 |
| 2007/0235077 A1 | 10/2007 | Nagata et al. |
| 2007/0283997 A1 | 12/2007 | Hachtmann et al. |
| 2008/0000518 A1 | 1/2008 | Basol |
| 2008/0093221 A1* | 4/2008 | Basol .................... 205/170 |
| 2009/0229666 A1* | 9/2009 | Corneille et al. ..... 136/262 |
| 2009/0283137 A1* | 11/2009 | Croft et al. ........... 136/251 |

FOREIGN PATENT DOCUMENTS

WO    WO 2007022221 A2    2/2007

OTHER PUBLICATIONS

International Search Report issued Aug. 17, 2009 in PCT/US2009/048468.

International Search Report issued Aug. 17, 2009 in PCT/Us09/048468.

* cited by examiner

PRIOR ART

METHOD AND APPARATUS FOR ACHIEVING LOW RESISTANCE CONTACT TO A METAL BASED THIN FILM SOLAR CELL

RELATED APPLICATIONS

This application is a continuation-in-part and claims priority to U.S. patent application Ser. No. 12/163,162, filed Jun. 27, 2008, which is a continuation-in-part of U.S. patent application Ser. No. 12/111,161, filed Apr. 28, 2008 now abandoned and this application is also a continuation-in-part and claims priority to U.S. patent application Ser. No. 12/123,424, filed May 19, 2008, and all applications referred to above are expressly incorporated by reference herein.

BACKGROUND

1. Field of the Invention

The present invention generally relates to thin film solar cell fabrication, more particularly, to techniques for manufacturing solar cells based on Group IBIIIAVIA thin film semiconductors.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. It should be noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

Figure 1:
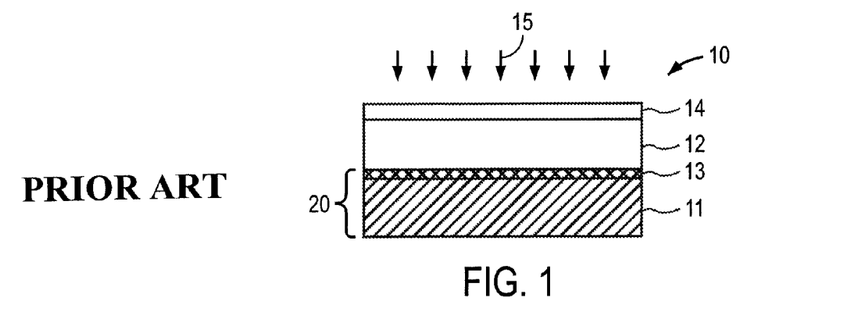
FIG. 1 is a side schematic view of a prior-art solar cell.

The structure of a conventional Group IBIIIAVIA compound photovoltaic cell such as a $Cu(In,Ga,Al)(S,Se,Te)_2$ thin film solar cell is shown in FIG. 1. A photovoltaic cell 10 is fabricated on a substrate 11, such as a sheet of glass, a sheet of metal, an insulating foil or web, or a conductive foil or web. An absorber film 12, which comprises a material in the family of $Cu(In,Ga,Al)(S,Se,Te)_2$, is grown over a contact layer 13, which is previously deposited on the substrate 11 and which acts as the electrical contact to the absorber film 12 of the device. The substrate 11 and the contact layer 13 form a base 20 on which the absorber film 12 is formed. Various contact layers comprising Mo, Ta, W, Ti, and their nitrides have been used in the solar cell structure of FIG. 1. If the substrate itself is a properly selected conductive material, it is possible not to use the contact layer 13, since the substrate 11 may then be used as the ohmic contact to the device. After the absorber film 12 is grown, a transparent layer 14 or window layer such as a CdS, ZnO, CdS/ZnO or CdS/ZnO/ITO stack is formed on the absorber film 12. Radiation 15 enters the device through the transparent layer 14. A metallic grid pattern or finger pattern (not shown) comprising busbars and fingers may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side.

If the substrate 11 of the CIGS(S) type cell shown in FIG. 1 is a metallic foil, a positive voltage develops on the substrate 11 with respect to the transparent layer 14 under illumination. In other words, an electrical wire (not shown) that may be attached to the substrate 11 would constitute the (+) terminal of the solar cell 10 and a lead (not shown) that may be connected to the transparent layer 14 (or to a busbar of the metallic grid pattern that may be deposited on the transparent layer 14) would constitute the (−) terminal of the solar cell.

After fabrication, individual solar cells are typically assembled into solar cell strings and circuits by interconnecting them (usually in series) electrically, i.e. by connecting the (+) terminal of one cell to the (−) terminal of a neighboring cell. This way the total voltage of the solar cell circuit is increased. The solar cell circuit is then laminated into a protective package to form a photovoltaic module.

For a device structure of FIG. 1, if the substrate 11 is a conductive metallic foil, series interconnection of cells may be carried out by connecting the substrate 11 at the back or un-illuminated side of one particular cell to the busbar of the grid pattern (not shown) at the front or illuminated side of the adjacent cell. A common industry practice is to use conductive wires, preferably in the form of strips of flat conductors or ribbons to interconnect a plurality of solar cells to form first a cell string, then a circuit and then a module. Such ribbons are typically made of copper, coated with tin and/or silver. For standard crystalline Si-based technology, ribbons are attached to the front and back sides of the cells in the module structure by means of a suitable soldering material since both the top grid pattern of the cell and the bottom contact of the cell comprise easily solderable metallic materials such as silver. High temperature solders with processing temperatures in excess of 200° C., typically in excess of 300° C., may be used in the interconnection of Si cells to form "strings" which may then be interconnected by a process called "bussing" to form the circuit. The circuit is laminated in a protective package to form the module.

Unlike Si solar cells, the thin film Group IBIIIAVIA compound solar cell of FIG. 1 may be fabricated on a metallic foil substrate such as a flexible stainless steel web or aluminum alloy foil. These materials may not be easily soldered, especially since the process temperature for this type of solar cell is limited to less than about 250° C., preferably less than 200° C. Therefore, conductive adhesives are usually employed to attach the Cu ribbons to the busbars of the grid pattern and the back contact or the back surface of the metallic substrate of such solar cells during their interconnection. Although such techniques are in use in products, the contact resistance of the electrical contacts attached by conductive adhesives to the back surface of the metal foil substrate still needs to be reduced. Adhesion of the contact to the back surface of the metallic foil substrates also needs improvement.

In a typical solar cell string or circuit fabrication process, the solar cells are first completely processed except for the Cu ribbons. In other words, the cell comprises a conductive bottom or back contact and a top contact comprising a grid pattern or finger pattern with busbars and fingers on the front side. The cells are then measured under standard illumination and separated or binned according to their efficiency or short circuit current values. This process is often called "cell sorting". Cell sorting works well for standard Si solar cells because both the bottom contact and the top grid pattern of standard Si solar cells comprise highly conductive materials such as screen printed silver. Therefore, when cells are placed on a metallic platform, preferably with vacuum suction so that a good physical contact is established between the metallic platform and the back side of the cell, a low resistance ohmic contact is obtained between the metallic platform and the back side of the cell. The busbars of the top grid pattern are then contacted by temporary, spring loaded contact points, and the front surface of the cell is illuminated. The illuminated current-voltage characteristics are measured between the temporary contact pins and the metallic platform touching the back side of the device. Since the electrical contact between the back surface of the cell and the metallic platform is good, the measured I-V characteristics do not get influenced much by this electrical contact. After cell sorting, devices in each bin, representing different I-V characteristics, are stringed together. This way matching cells are interconnected to maximize the efficiency of the cell strings. Cell strings are interconnected to form circuits and circuits are encapsulated in a protective package to form modules. During cell stringing, the back contact on the back surface of a first cell is electrically connected to a front contact or busbar of a second cell by soldering (or by conductive adhesive) a Cu ribbon to the back contact of the first cell and to the busbar of the second cell. There are a variety of automated manufacturing tools available to string the already binned or sorted cells to form cell strings. As can be appreciated the ability to measure the I-V characteristics of a solar cell, i.e. cell sorting or binning or classification, before attaching a Cu-ribbon to its back surface is important for this process flow. Without this capability, high throughput stringing tools cannot be used to form well matching strings and modules with optimum efficiency. It should be noted that if unmatched cells rather than sorted or classified cells are interconnected to form a string, the efficiency of the string would be dominated by the lowest performing device in the string.

CIGS thin film solar cells fabricated on metal foil substrates present challenges for cell sorting. When a metal foil based CIGS solar cell is fabricated using a metal foil with a front surface and a back surface, the absorber layer is first formed over the front surface of the metallic foil substrate, a window layer such as a CdS/ZnO stack or a CdS/ZnO/ITO stack is then deposited on the absorber layer, and a finger pattern with busbar(s) is formed on top of the window layer. After fabrication the cell needs to be measured and binned. However, metal foils such as stainless steel foils and aluminum alloy based web that are used for the fabrication of such solar cells, develop poorly conducting, high resistance surface films on their back surfaces, which are exposed to air and to various process environments employed during the fabrication of the cell. The metal foils also experience high temperatures in the range of 100-600 C during such processes. As a result, when the completed CIGS cell is placed on a metallic platform to measure its I-V characteristics (before attaching a Cu ribbon to its back surface) the electrical contact between the metallic platform and the back surface of the device (which is the back surface of the foil substrate) is poor. Consequently, the measured I-V characteristics, especially the fill factor of the device are negatively impacted by the resistance of this electrical contact. Since the contact resistance between the back surface of the cell and the metallic platform depends on the resistance and thickness of the poorly conducting surface films on the back side of the metallic substrate, the contact resistance varies from cell to cell and is not constant. As a result, binning or sorting of metal foil based CIGS solar cells is not reliable. Therefore, strings made using such binned cells do not yield the highest conversion efficiencies they would have provided if the cells were reliably binned.

Therefore, there is a need to develop approaches that will make cell sorting possible for metal foil based thin film solar cells. There is also a need to reduce the contact resistance and enhance the adhesion of contact leads such as Cu ribbons attached to the back side of metallic foil substrates. Such improvements are expected to enhance device efficiency and manufacturability and long term reliability of these modules.

SUMMARY OF THE INVENTION

A system and method of forming a thin film solar cell with a metallic foil substrate is described.

In one aspect, after forming a semiconductor absorber film over the front surface of the metallic foil substrate a back surface of the metallic foil substrate is treated using a material removal process to form a treated back surface in a process chamber.

In another aspect the material removal process is performed while depositing a transparent conductive layer over the semiconductor absorber film in the process chamber.

In a particular aspect, a method is provided that includes providing a metallic foil substrate having a front surface and a back surface; forming a semiconductor absorber film over the front surface of the metallic foil substrate, the step of forming also causing formation of a surface film on the back surface of the metallic foil substrate; removing at least a portion of the surface film from the back surface in a process chamber to form a treated back surface contact area on the back surface of the metallic foil substrate; and depositing a transparent conductive layer over the semiconductor absorber film in the process chamber.

In another particular aspect, a method is provided that includes providing a metallic foil substrate having a front surface and a back surface; forming a sacrificial layer on the back surface of the metallic foil substrate, the sacrificial layer being substantially non-reactive with Group VIA materials; growing a Group IBIIIAVIA absorber film over the front surface of the metallic foil substrate; removing the sacrificial layer from the back surface to form a treated back surface contact area in a process chamber; and depositing a transparent conductive layer over the Group IBIIIAVIA absorber film in the process chamber.

In another particular aspect, there is provided a system that includes a moving mechanism for supplying a continuous flexible workpiece into the system, the continuous flexible workpiece including a continuous conductive substrate having a Group IBIIIAVIA compound absorber layer disposed over a front surface of the continuous conductive substrate; a transparent conductive layer deposition sub-system located within a process chamber to form a transparent conductive layer on the Group IBIIIAVIA compound absorber layer using at least one material deposition device; and a treatment sub-system comprising at least one material removing device located within the process chamber to apply a material removal process to remove a surface film from a back surface of the continuous conductive substrate and obtain a treated back surface contact area as the transparent conductive layer is formed on the Group IBIIIAVIA compound absorber layer.

These and other aspects and advantages of the invention are described herein.

DETAILED DESCRIPTION OF THE INVENTION

The present invention provides a method and apparatus for applying a treatment to the back surface of the solar cells having metallic substrates before classifying, binning or sorting the cells and before applying contact leads to the back surface of the metallic substrates for interconnecting the solar cells to form strings, circuits and modules. The invention will be described using an interconnection process or stringing process for preferably thin film CIGS solar cells formed on flexible metallic foil substrates. The treatment method is applied to at least a portion of a back surface of the solar cells, i.e., metallic foil substrate back surface, before establishing electrical contacts to such surfaces by attaching wires or ribbons. In one embodiment, the treatment process comprises a dry etching process. It should be noted that dry etching refers to an etching process that does not utilize any liquid chemicals or etchants to remove materials from the substrate back surface, generating only volatile byproducts in the process. Dry etching may be accomplished by any of the following: 1) through chemical reactions that consume the material, using chemically reactive gases or plasma; 2) physical removal of the material, usually by momentum transfer; or 3) a combination of both physical removal and chemical reactions. Plasma etching is an example of a purely chemical dry etching technique. On the other hand, physical sputter etching where the surface to be etched is made cathodic and is bombarded by gas ions, and ion beam milling are examples of purely physical dry etching techniques. Lastly, reactive ion etching is an example of dry etching that employs both physical and chemical processes. In a preferred embodiment of the present invention the dry etching process is a physical dry etching process.

In another embodiment the dry etching process is carried out as a transparent conductive layer is deposited over the CIGS absorber layer. Therefore, the transparent conductive layer deposition as well as the dry etching of the back surface of the metallic substrate is carried out in the same processing tool. In one embodiment both the dry etching and the transparent conductive layer deposition processes are carried out in a roll-to-roll manner on a device structure that is in the form of a long web. The dry etching process removes at least a portion of an unwanted high resistivity material film from the substrate back surface. As described in the background section, such unwanted material films may be formed on the back surface during various processing steps used to form the solar cell structure, or during exposure of the structure to air. Such process steps include, but are not limited to selenization and buffer layer (such as CdS) deposition, etc. Removal of the high resistance unwanted material provides a fresh back surface of the flexible foil substrate which can be effectively contacted by a metallic platform of a cell sorting system. Therefore, cell sorting is enabled by the present invention. Furthermore, the fresh back surface of the metallic foil substrate resulting from the treatment step provides a good surface to make well adhering low resistance ohmic contact when leads are attached to it during stringing.

In an alternative embodiment a conductive layer is deposited over the back surface of the metallic substrate after the treatment process. This conductive layer provides a conductive fresh surface which can be effectively contacted by a metallic platform of a cell sorting system. Therefore, cell sorting is enabled by the present invention. Furthermore, the fresh surface of the conductive layer provides a good surface to make well adhering low resistance ohmic contact when leads are attached to it during stringing.

In another embodiment, a sacrificial surface protection layer is first deposited on the back surface of the metallic foil substrate before the solar cell absorber is formed over the front surface of the metallic foil substrate, and then this sacrificial surface protection layer is removed at the end of cell processing cycle before establishing electrical contacts to the back surface of the metallic substrate by attaching wires or ribbons. A preferred method for removing the sacrificial surface protection layer is a dry etching process such as ion milling or etching. In one preferred embodiment the removal of the sacrificial surface protection layer is carried out as a transparent conductive layer is deposited over the CIGS absorber layer. Therefore, the transparent conductive layer deposition as well as the dry etching of the sacrificial surface protection layer is carried out in the same processing tool. In an alternative embodiment a conductive layer is deposited over the back surface of the metallic substrate after the step of removing the sacrificial surface protection layer. This conductive layer assures a good ohmic contact when leads are attached to the back surface of the device.

Figure 2A:
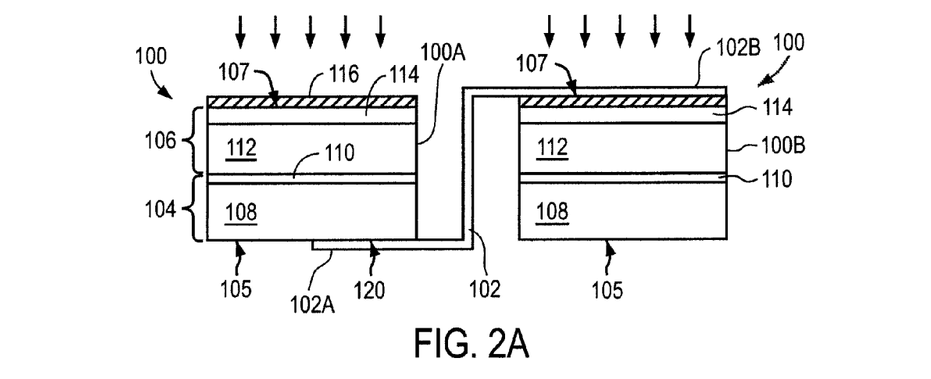
FIG. 2A is a side schematic cross sectional view of two solar cells taken along the line 2A-2A in FIG. 2B, wherein the solar cells have been interconnected using an embodiment of a process of the present invention.
Figure 2B:
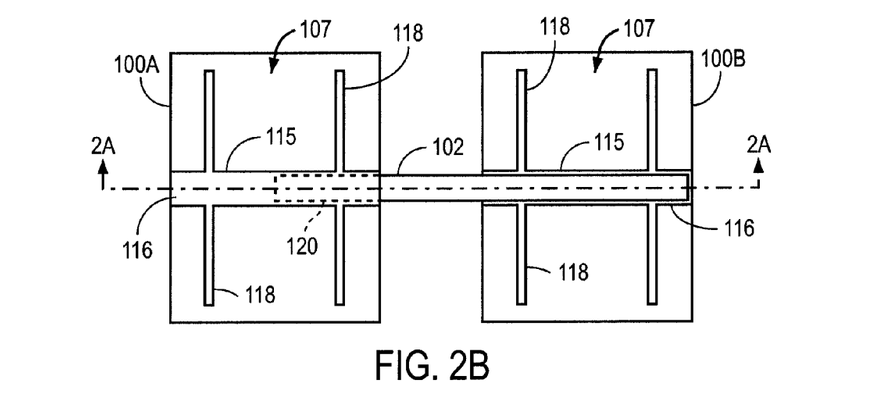
FIG. 2B is top schematic view of the solar cells shown in FIG. 2A.

FIGS. 2A and 2B show exemplary solar cells 100 such as a first solar cell 100A and a second solar cell 100B which are interconnected by a conductive lead 102, or interconnect, using the process of the present invention. Although the process is exemplified using two solar cells, by using the interconnecting or stringing process of the present invention a plurality of solar cells may be interconnected forming strings and circuits. The conductive lead may be a strip of metal, preferably a conductive ribbon made of copper or any another conductor. Each solar cell 100 comprises a base portion 104 having a back surface 105 and a front portion 106 having a front surface 107. The base portion 104 includes a substrate 108 and a contact layer 110 formed on the substrate. For this embodiment, a preferred substrate material may be a metallic material such as stainless steel, aluminum (Al) or the like. An exemplary contact layer material may be molybdenum (Mo). The front portion 106 may comprise an absorber layer 112, such as a CIGS absorber layer which is formed on the contact layer 110, and a transparent layer 114, such as a buffer-layer/ TCO stack, formed on the absorber layer where TCO stands for transparent conductive oxide. It should be noted that the transparent layer 114 may be a stack comprising a high resistance layer (such as a transparent sulfide buffer layer) and a highly conductive transparent layer (such as TCO). However, the overall conductivity of the transparent layer 114 would be dominated by the highest conductivity layer (such as TCO) within its stack. In that respect the transparent layer 114 is sometimes called a conductive transparent layer, although there may be non-conductive or poorly conductive layers within its structure. An exemplary buffer layer may be a (Cd,Zn)S layer. An exemplary TCO layer may be a ZnO layer, an indium tin oxide (ITO) layer or a stack comprising both ZnO and ITO. A terminal 115, or a finger pattern, including a busbar 116 and conductive fingers 118 may be formed over the front surface 107 as shown in FIG. 2B.

The conductive lead or ribbon 102 electrically connects a contact area 120 formed on the back side 105 of the solar cell 100A to the terminal 115 of the solar cell 100B. Of course, another contact area may also be formed on the back side of the solar cell 100B to connect the solar cell 100B to the next solar cell (not shown) and so on, in a multiple solar cell stringing scheme. The contact area 120 is formed on the back surface 105 of the solar cell 100A by treating at least a portion of the back surface 105 of the substrate 108. The treatment process is a dry etching process, preferably an ion milling process which may optionally be followed by a conductive layer deposition step. In a preferred embodiment, the treatment process is carried out in the same tool that is used for the deposition of the transparent layer. The treatment process removes at least a portion of the unwanted material layers, such as oxides, selenides, sulfides and others, from the back surface 105 and exposes the fresh substrate material itself, thereby forming a contact area substantially free from high resistance species. This freshly exposed substrate back surface portion provides a secure bonding location on the substrate for the conductive lead. In this respect the contact area 120 may be limited to a location on the back surface 105 of the solar cell 100A, which is near the solar cell 100B, as shown in FIGS. 2A and 2B. Alternatively the contact area may be formed as a strip extending across the back surface and aligned with the projection of the busbar. Preferably the contact area may be formed to cover the entire back surface so that during cell sorting substantially the whole back surface of the cell makes good electrical contact to the metallic platform of the cell sorting system or tool.

During the stringing process, a first end 102A of the conductive lead 102 is attached to the contact location 120. A bonding material may be applied to at least one of the contact area and the surface of the first end 102 before attaching the conductive lead to the contact area. Similarly, a second end 102B of the conductive lead 102 is attached to a location on the busbar 116 of the solar cell 100B using the bonding material. The bonding material may be a conductive adhesive such as Ag-filled adhesive, solder material or the like. Depending on the nature of the bonding material, appropriate process steps, such as application of heat and pressure, are also carried out to bond the ends of the conductive lead to the cells.

Figure 3:
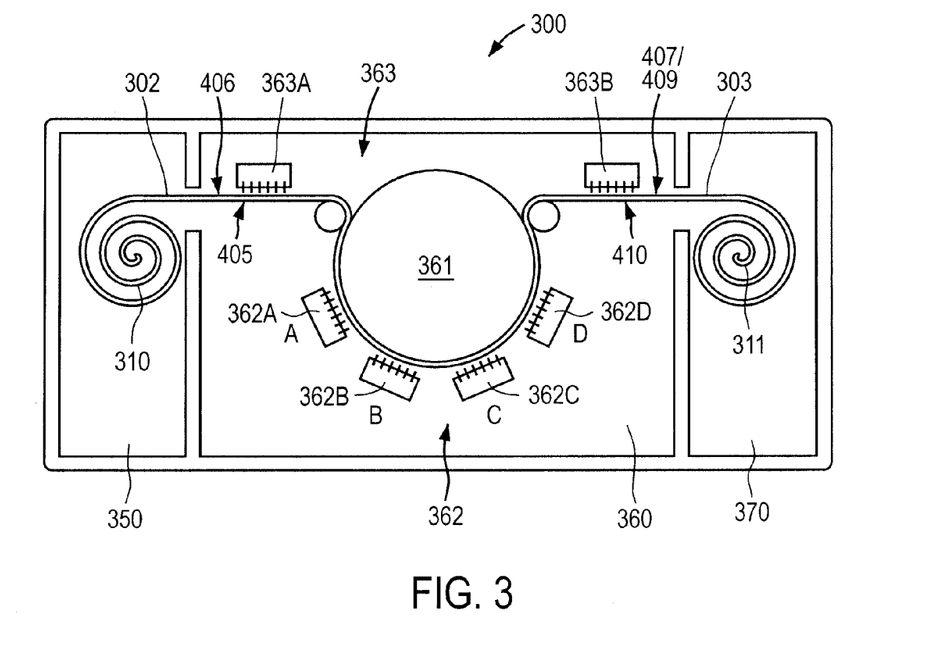
FIG. 3 is a schematic view of an apparatus in accordance with an embodiment of the present invention.
Figure 4A:
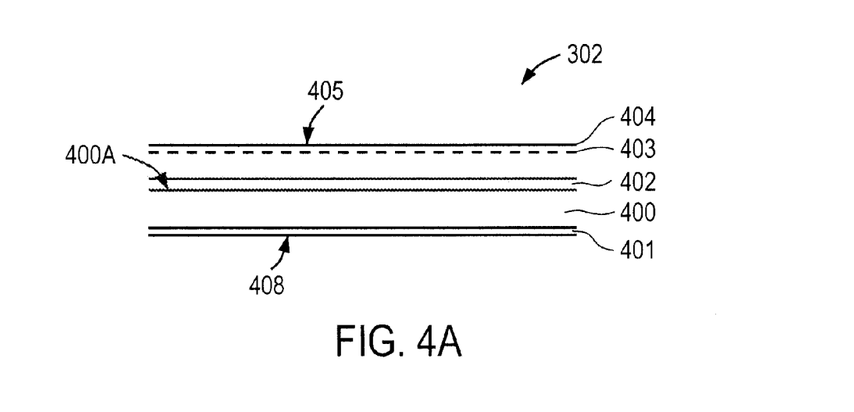
FIG. 4A is a schematic cross sectional view of a flexible workpiece to be processed in the apparatus of FIG. 3.

FIG. 3 shows a roll to roll system 300 to deposit a transparent conductive layer such as ZnO and/or ITO to form a thin film CIGS solar cell structure and at the same time conduct the process of the present invention on a continuous flexible workpiece 302 to form a treated solar cell structure 303. The continuous flexible workpiece 302 is exemplified in FIG. 4A and two versions of the treated solar cell structure 303 are exemplified in FIGS. 4B and 4C as solar cell structure 303A and 303B, respectively. Referring to FIG. 4A the continuous workpiece 302 comprises a metallic foil substrate 400 having a back surface and a front surface 400A. A contact layer 402 is formed on the front surface 400A. A solar cell absorber 403 such as a Group IBIIIAVIA compound layer is formed over the contact layer 402 and an optional buffer layer 404 is formed on the solar cell absorber 403. As described before the buffer layer 404 may be a sulfide layer such as Cd-sulfide or In-sulfide and the like. The continuous workpiece 302 has a top exposed surface 405 and a bottom exposed surface 406. As discussed earlier there is a surface film 401 on the back surface of the metallic substrate 400 that needs to be removed.

The roll to roll system 300 of FIG. 3 has a loading compartment 350, a process compartment 360 and an unloading compartment 370. The continuous flexible workpiece 302 is loaded into the loading compartment 350 in the form of a feeding roll 310, extends into the process compartment 360 and the treated solar cell structure 303 is rolled up into a receiving roll 311 in the unload compartment 70. During processing, successive sections of the flexible workpiece 302 are moved from the loading compartment 350, to the process compartment 360 and into the unloading compartment 370 in a roll to roll manner while the processes of the present invention are applied to the flexible workpiece 302 in the process compartment 360.

Figure 4B:
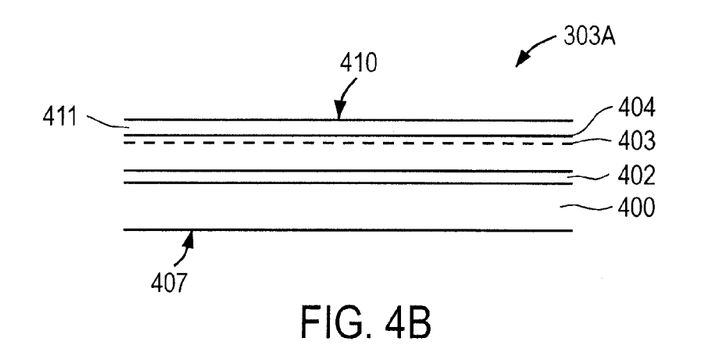
FIG. 4B is a schematic cross sectional view of a solar cell structure formed in accordance with an embodiment of the present invention.
Figure 4C:
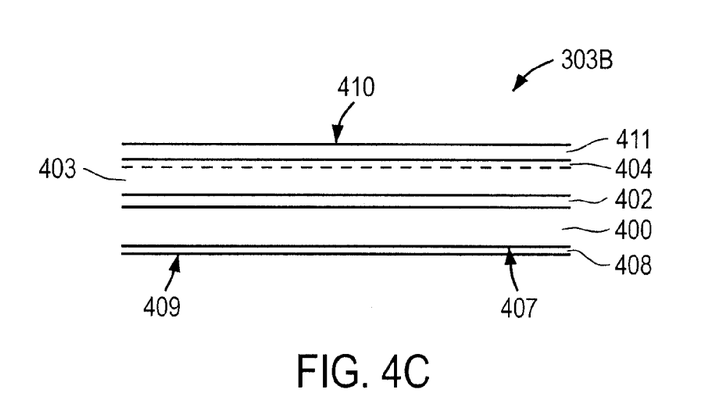
FIG. 4C is a schematic cross sectional view of another solar cell structure formed in accordance with another embodiment of the present invention.

In the process compartment 360 there may be a treatment sub-system 363 including treatment devices 363A, 363B, and deposition sub-system 360 including devices 362A-362D which may be placed along a circumference of a rotating drum 361. Each sub system 363 or 360 may include one or more devices. It should be appreciated that instead of a rotating drum configuration, a linear or in-line tool design may also be used to practice this invention. The treatment devices 363A, 363B are configured so that they can apply treatment to the bottom exposed surface 406 of the flexible workpiece 302. The deposition devices 362 are configured so that they can deposit material over the top exposed surface 405 of the flexible workpiece 302. In an exemplary process employing the flexible workpiece 302 of FIG. 4A, as a section of the flexible workpiece 302 travels in front of the treatment device 363 A, a material removal process is applied to the bottom exposed surface 406. The material removal processes may preferably include dry etching such as plasma etching (RF or DC) and ion milling processes and they remove the surface film 401 from the back surface of the metallic substrate leaving a fresh surface 407 as shown in FIG. 4B. The cleaned section of the flexible workpiece then travels to and passes in front of the deposition devices 362, which deposit at least one transparent conductive material (such as zinc oxide, indium tin oxide and indium zinc oxide) on the top exposed surface 405, forming a transparent conductive layer 411. As a result when the section of the original flexible workpiece leaves the proximity of the last deposition device 362 it has the solar cell structure 303A depicted in FIG. 4B. The solar cell structure 303A has a clean treated bottom surface 407, and a transparent conductive layer 411 deposited on the buffer layer 404. It should be noted that an additional treatment device 363B may also be used and more material removal process, such as dry etching may be applied to the back surface using this additional device, to achieve better cleaning. This structure may be further processed in another tool to deposit finger patterns or terminal structures on the top surface 410 of the transparent conductive layer 411. The deposition process for the transparent conductive layer 411 is preferably a sputtering process such as RF sputtering, DC sputtering, RF-DC sputtering, DC-pulse sputtering, reactive sputtering, etc. The transparent conductive layer may comprise an undoped ZnO/doped ZnO stack, an undoped ZnO/ITO stack or undoped ZnO/Indium Zinc Oxide stack, etc.

Referring to FIG. 5, which shows a top view of a completed solar cell structure 500 after the deposition of terminal structures 314, the terminal structures 314 are formed on the top surface 410 of the transparent conductive layer 411, preferably using a screen printing process. The termrinal structures 314 include busbar lines 316 and conductive fingers 318 that are configured in a fishbone design. Dotted lines depict location of each individual cell which will be cut out from the continuous workpiece after the process of the present invention. As will be appreciated from the foregoing discussion the completed solar cell structure 500 is ready for cutting into individual solar cells and then interconnecting the individual solar cells to form circuits and modules. The clean treated bottom surface 407 has low resistance and conductive leads such as copper ribbons may be readily attached to this cleaned surface forming low resistance contacts that adhere well to the metallic substrate.

The surface film 401 on the back surface of the metallic substrate 400 may be an oxide, sulfide, selenide, etc. film that may have resulted from the previous process steps of the overall manufacturing approach. These steps include process steps to form the contact layer 402, the solar cell absorber layer 403 and the buffer layer 404. Furthermore, exposure of metallic foils such as stainless steel and aluminum based foils are known to develop passivated oxide surfaces comprising, for example, chromium oxide and aluminum oxide. Alternately, the surface film 401 may be a sacrificial film that is intentionally formed to protect the metallic substrate during the previous processing steps cited above. Therefore, it may, for example, comprise an oxide, nitride, carbide etc. that resists reaction with Group VIA materials and as a result protect the metallic substrate 400 during the formation of a Group IBIIIAVIA compound absorber in a process atmosphere containing Group VIA materials such as Se and S at high temperatures. In any case, all of these materials that may be present in the surface film 401 may introduce high resistance to the surface and need to be removed as explained above with reference to the present invention.

In an alternative embodiment, the treatment devices 363A and 363B are employed to apply both a removal process and a deposition process to the back side of the metallic foil substrate. For example, if the treatment device 363A applies a removal process and the treatment device 363B applies a deposition process to the back side, the solar cell structure 303B depicted in FIG. 4C may be obtained. In this case the clean treated bottom surface 407 is coated by a high conductivity layer 408 providing a clean and fresh surface 409. The high conductivity layer may be any appropriate film that can provide low ohmic contact to the metallic substrate 400. The choice of materials for this layer is limitless because all high temperature steps with reactive environments that are employed in forming the solar cell have already been completed. Therefore, a thin layer of Ni, Cu, Ag, Al, Zn, Mo, Cr, W, Ta, metallic alloys, solder materials, etc., for example, is appropriate as the highly conducting layer 408, whereas if a thin Ni, Cu or Ag layer, for example, was deposited on the back surface of the metallic foil before the formation of, for example, a CIGS absorber layer, Ni, Cu and Ag would react with Se and form high Ni-selenide, Cu-selenide and Ag-selenide phases that would create high resistivity films, peeling and other problems, such as particle generation during processing. Other materials that may be used in the highly conductive layer 408 include but are not limited to conductive nitrides such as nitrides of Mo, W, Ti, and the like.

Although the present invention is described with respect to certain preferred embodiments, modifications thereto will be apparent to those skilled in the art.

We claim:

1. A method of forming a thin film solar cell, the method comprising:
   providing a metallic foil substrate having a front surface and a back surface;
   forming a semiconductor absorber film over the front surface of the metallic foil substrate, the step of forming also causing formation of a surface film on the back surface of the metallic foil substrate;
   removing at least a portion of the surface film from the back surface in a process chamber to form a treated back surface contact area on the back surface of the metallic foil substrate;
   depositing a transparent conductive layer over the semiconductor absorber film in the process chamber, wherein the steps of removing and depositing both occur at the same time in the process chamber;
   forming a conductive layer on the treated back surface contact area in the process chamber; and
   attaching at least one electrical lead contact onto the conductive layer wherein the step of attaching is performed using a conductive adhesive applied between an exposed surface of the conductive layer and the at least one electrical lead contact.

2. The method of claim 1 further comprising a step of attaching at least one electrical lead contact onto the treated back surface contact area of the metallic foil.

3. The method of claim 1, wherein the semiconductor absorber film is a Group IBIIIAVIA compound film.

4. The method of claim 1, wherein the transparent conductive layer comprises one of zinc oxide, indium tin oxide and indium zinc oxide.

5. The method of claim 1 wherein forming the conductive layer on the treated back surface contact area occurs in the process chamber.

6. The method of claim 1, wherein the material removal process is a dry etching process.

7. The method of claim 1, wherein the semiconductor absorber film is a Group IBIIIAVIA compound film.

8. The method according to claim 1 wherein the process chamber is a process chamber of a roll-to-roll processing system, wherein the metallic foil substrate is a continuous flexible substrate, wherein the step of forming the semiconductor absorber film results in a continuous flexible workpiece including the continuous flexible substrate and the semiconductor absorber film, and
   wherein the removing and depositing steps occur as the continuous flexible workpiece is advanced through the process chamber of the roll to roll processing system.

9. The method of claim 2 wherein the step of attaching is performed using a conductive adhesive applied between the treated back surface contact area and the at least one electrical lead contact.

10. The method of claim 6, wherein the dry etching process is at least one of an ion milling and sputter etching process.

11. The method of claim 7 further comprising a step of depositing a contact layer on the front surface of the metallic foil substrate before the step of forming the Group IBIIIAVIA compound film.

12. The method of claim 11 further comprising:
   depositing a buffer layer on a surface of the Group IBIIIA-VIA compound film, wherein the buffer layer comprises at least one of an oxide, sulfide and selenide; and wherein the transparent conductive layer is sputter deposited in the process chamber.

13. The method of claim 12 wherein the step of removing is carried out by at least one of ion milling and sputter etching.

14. The method of claim 12 further comprising a step of attaching at least one electrical lead contact onto the treated back surface contact area of the metallic foil.

15. The method of claim 14, wherein the step of attaching is performed using a conductive adhesive applied between the treated back surface contact area of the metallic foil and the at least one electrical lead contact.

16. The method of claim 8, wherein the semiconductor absorber film is a Group IBIIIAVIA compound film.

17. The method of claim 8 further comprising forming a conductive layer on the treated back surface contact area.

18. The method of claim 16, wherein the step of removing includes a dry etching process and the step of depositing is carried out by sputter depositing.

19. The method of claim 18, wherein the dry etching process is at least one of an ion milling and sputter etching.

20. The method of claim 19 further comprising a step of depositing a buffer layer on the surface of the Group IBIIIAVIA compound film before the step of depositing the transparent conductive layer wherein the transparent conductive layer comprises a transparent conductive oxide and the buffer layer comprises at least one of an oxide, sulfide and selenide.

21. The method of claim 17 further comprising a step of depositing a buffer layer on the surface of the Group IBIIIAVIA compound film before the step of depositing the transparent conductive layer wherein the transparent conductive layer comprises a transparent conductive oxide and the buffer layer comprises at least one of an oxide, sulfide and selenide.

22. A method of forming a thin film solar cell, the method comprising:
providing a metallic foil substrate having a front surface and a back surface, wherein the metallic foil substrate has the front surface with an average roughness of less than 50 nm and the back surface with an average roughness of more than 200 nm;
forming a semiconductor absorber film over the front surface of the metallic foil substrate, the step of forming also causing formation of a surface film on the back surface of the metallic foil substrate;
removing at least a portion of the surface film from the back surface in a process chamber to form a treated back surface contact area on the back surface of the metallic foil substrate; and
depositing a transparent conductive layer over the semiconductor absorber film in the process chamber.

23. The method according to claim 22 wherein the back surface that has an average roughness of more than 500 nm.

24. The method according to claim 22 wherein the back surface that has an average roughness of more than 1000 nm.

25. The method of claim 22, wherein the steps of removing and depositing both occur at the same time in the process chamber.

26. The method of claim 22 further comprising a step of attaching at least one electrical lead contact onto the treated back surface contact area of the metallic foil.

27. The method of claim 22, wherein the semiconductor absorber film is a Group IBIIIAVIA compound film.

28. The method of claim 22, wherein the transparent conductive layer comprises one of zinc oxide, indium tin oxide and indium zinc oxide.

29. The method of claim 22 further comprising forming a conductive layer on the treated back surface contact area.

30. The method of claim 22, wherein the material removal process is a dry etching process.

31. The method of claim 22, wherein the semiconductor absorber film is a Group IBIIIAVIA compound film.

32. The method according to claim 22 wherein the process chamber is a process chamber of a roll-to-roll processing system, wherein the metallic foil substrate is a continuous flexible substrate, wherein the step of forming the semiconductor absorber film results in a continuous flexible workpiece including the continuous flexible substrate and the semiconductor absorber film, and
wherein the removing and depositing steps occur as the continuous flexible workpiece is advanced through the process chamber of the roll to roll processing system.

33. The method of claim 25 further comprising forming a conductive layer on the treated back surface contact area in the process chamber.

34. The method of claim 33 further comprising a step of attaching at least one electrical lead contact onto the conductive layer.

35. The method of claim 34 wherein the step of attaching is performed using a conductive adhesive applied between an exposed surface of the conductive layer and the at least one electrical lead contact.

36. The method of claim 26 wherein the step of attaching is performed using a conductive adhesive applied between the treated back surface contact area and the at least one electrical lead contact.

37. The method of claim 29 wherein forming the conductive layer on the treated back surface contact area occurs in the process chamber.

38. The method of claim 30, wherein the dry etching process is at least one of an ion milling and sputter etching process.

39. The method of claim 31 further comprising a step of depositing a contact layer on the front surface of the metallic foil substrate before the step of forming the Group IBIIIAVIA compound film.

40. The method of claim 39 further comprising:
depositing a buffer layer on a surface of the Group IBIIIAVIA compound film, wherein the buffer layer comprises at least one of an oxide, sulfide and selenide; and
wherein the transparent conductive layer is sputter deposited in the process chamber.

41. The method of claim 40 wherein the step of removing is carried out by at least one of ion milling and sputter etching.

42. The method of claim 40 further comprising a step of attaching at least one electrical lead contact onto the treated back surface contact area of the metallic foil.

43. The method of claim 42, wherein the step of attaching is performed using a conductive adhesive applied between the treated back surface contact area of the metallic foil and the at least one electrical lead contact.

44. The method of claim 32, wherein the semiconductor absorber film is a Group IBIIIAVIA compound film.

45. The method of claim 32 further comprising forming a conductive layer on the treated back surface contact area.

46. The method of claim 44, wherein the step of removing includes a dry etching process and the step of depositing is carried out by sputter depositing.

47. The method of claim 46, wherein the dry etching process is at least one of an ion milling and sputter etching.

48. The method of claim 47 further comprising a step of depositing a buffer layer on the surface of the Group IBIIIAVIA compound film before the step of depositing the transparent conductive layer wherein the transparent conductive layer comprises a transparent conductive oxide and the buffer layer comprises at least one of an oxide, sulfide and selenide.

49. The method of claim 45 further comprising a step of depositing a buffer layer on the surface of the Group IBIIIA-VIA compound film before the step of depositing the transparent conductive layer wherein the transparent conductive layer comprises a transparent conductive oxide and the buffer layer comprises at least one of an oxide, sulfide and selenide.

50. A method of fabricating a thin film solar cell, the method comprising:
   providing a metallic foil substrate having a front surface and a back surface;
   forming a sacrificial layer on the back surface of the metallic foil substrate, the sacrificial layer being substantially non-reactive with Group VIA materials;
   growing a Group IBIIIAVIA absorber film over the front surface of the metallic foil substrate;
   removing the sacrificial layer from the back surface to form a treated back surface contact area in a process chamber; and
   depositing a transparent conductive layer over the Group IBIIIAVIA absorber film in the process chamber.

51. The method of claim 50, wherein the steps of removing and depositing both occur at the same time in the process chamber.

52. The method of claim 50 further comprising forming a conductive layer on the treated back surface contact area.

53. The method of claim 50, wherein the step of removing is carried out using a dry etching process and the step of depositing is carried out by sputter depositing.

54. The method of claim 50 further comprising a step of depositing a contact layer on a front surface of the metallic foil substrate before the step of forming the Group IBIIIAVIA compound film.

55. The method of claim 50, wherein the sacrificial layer comprises one of silicon oxide, aluminum oxide, silicon nitride, molybdenum nitride, titanium nitride and tungsten nitride.

56. The method according to claim 50 wherein the metallic foil substrate has the front surface with an average roughness of less than 50 nm and the back surface with an average roughness of more than 200 nm.

57. The method of claim 51 further comprising forming a conductive layer on the treated back surface contact area in the process chamber.

58. The method of claim 51, wherein the transparent conductive layer comprises one of zinc oxide, indium tin oxide and indium zinc oxide.

59. The method of claim 51 further comprising a step of attaching at least one electrical lead contact onto the treated back surface contact area of the metallic foil.

60. The method of claim 57 further comprising a step of attaching at least one electrical lead contact onto the conductive layer.

61. The method of claim 60 wherein the step of attaching is performed using a conductive adhesive applied between the exposed surface of the conductive layer and the at least one electrical lead contact.

62. The method of claim 52 wherein forming the conductive layer on the treated back surface contact area occurs in the process chamber.

63. The method of claim 53, wherein the dry etching process is at least one of an ion milling process and sputter etching process.

64. The method of claim 63, wherein the transparent conductive layer comprises one of zinc oxide, indium tin oxide and indium zinc oxide.

65. The method of claim 54 further comprising a step of depositing a buffer layer on a surface of the Group IBIIIAVIA compound film, wherein the buffer layer comprises at least one of an oxide, sulfide and selenide; and
   wherein the transparent conductive layer is sputter deposited in the process chamber and wherein the step of removing is carried out using a dry etching process.

66. The method of claim 65 further comprising a step of attaching at least one electrical lead contact onto the treated back surface contact area of the metallic foil.

67. The method of claim 66, wherein the step of attaching is performed using a conductive adhesive applied between the treated back surface contact area of the metallic foil and the at least one electrical lead contact.

68. The method according to claim 56 wherein the back surface that has an average roughness of more than 500 nm.

69. The method according to claim 56 wherein the back surface that has an average roughness of more than 1000 nm.

* * * * *